United States Patent [19]

Harrison, Jr. et al.

[11] Patent Number: 4,659,910
[45] Date of Patent: Apr. 21, 1987

[54] AC-DC TRANSFER STANDARD TEMPERATURE SENSOR REVERSAL ERROR COMPENSATION CIRCUIT

[76] Inventors: Archie J. Harrison, Jr., 37 Richard Dr., Mount Arlington, N.J. 07856; Jerry Harper, 214 Central Ave., West Caldwell, N.J. 07006; Fred L. Katzmann, 48 Bennett Ave., Cedar Grove, N.J. 07009

[21] Appl. No.: 728,886

[22] Filed: Apr. 30, 1985

[51] Int. Cl.[4] .............................................. H05B 1/02
[52] U.S. Cl. .................................... 219/497; 219/501; 219/505; 374/181
[58] Field of Search ............... 219/504, 505, 494, 501, 219/497, 499; 374/197, 172, 179, 181; 307/117

[56] References Cited

U.S. PATENT DOCUMENTS 4,370,546  1/1983  Warner ................................ 219/494

OTHER PUBLICATIONS

Model 1600A-MOD88, Autobalance True RMS AC/DC Transfer Standard, Ballantino Laboratories--5-1984, pp. 3-31 to 3-15.

*Primary Examiner*—M. H. Paschall
*Attorney, Agent, or Firm*—Davis Hoxie Faithfull & Hopgood

[57] ABSTRACT

A compensation circuit for a heater wire and a temperature sensor, the temperature sensor generating a signal whose amplitude is dependent upon the amplitude of the voltage across the heater wire. The circuit comprises a comparator circuit and a priority encoder circuit for generating digital information that is a function of the amplitude of the voltage in the heater wire; a multiplexor/demultiplexor circuit, responsive to the digital information generated, for generating a reversal error compensation signal, the generated reversal error compensation signal having an amplitude that is a function of the Peltier and Thomson effects associated with the heater wire; and amplifier/chopper circuits adapted to generate a compensated sensor signal that is a function of the reversal error compensation signal and the uncompensated sensor signal. The amplitude of the compensated sensor signal is approximately that of the signal generated by the sensor in the absence of the Peltier and Thomson effects associated with the heater wire.

5 Claims, 2 Drawing Figures

AC-DC TRANSFER STANDARD TEMPERATURE SENSOR REVERSAL ERROR COMPENSATION CIRCUIT

BACKGROUND OF THE INVENTION

This invention generally relates to AC-DC transfer standards.

An AC-DC transfer standard provides a DC output voltage approximately equal to the true RMS value of a complex or sinusoidal AC signal (referred to hereinafter as an AC signal). In one type of transfer standard, the AC signal to be measured is applied to a heater element adjacent to or contacting a temperature sensor.

One type of temperature sensor is a bimetallic junction thermocouple, which comprises two wires of dissimilar metals that are joined at both ends. According to the Seebeck effect, heating one junction will induce a current in the wires. The joule heating caused by the AC signal induces a voltage in the thermocouple, which voltage is proportional to the temperature difference between the bimetallic junction adjacent the heater element and the cold junction temperature.

The thermocouple voltage is nulled by adjustment of a potentiometer, which is adjusted to apply an equal and opposite voltage to that generated by the thermocouple. Then, without changing the potentiometer setting, an easily measured DC voltage is substituted for the AC signal. The DC voltage amplitude is increased until the voltage generated by the thermocouple is again equal and opposite to the voltage generated by the potentiometer, as previously adjusted for the AC signal. When this null condition is reached, the amplitude of the DC voltage is measured. This DC amplitude is equal to the RMS value of the AC signal.

The heater element in such devices is typically a heater wire made of material having a relatively high electrical resistance, such as nickel-chromium alloy or Evanohm ® (the latter being preferred). The leads connected to the heater wire are typically made of material having a relatively low electrical resistance, such as Dumet. As a result of dissimilar metal contact, the junctions between the heater wire and its connecting leads experience a Peltier effect when DC current passes through the heater wire, meaning that one bimetallic junction of the heater wire is heated and the other end is cooled. At the same time, the heater wire experiences a Thomson effect, which causes heat to flow into or out of the heater wire when it is subject to a temperature gradient and current flows through it.

Because of the Peltier and Thompson effects, a sensor measuring temperature at the center of the heater wire, or at any other point on the heater wire, will sense different temperatures for DC currents passed through the heater wire of equal magnitude but of opposite polarity. This error is termed DC reversal error. In order to minimize DC reversal error in making transfer standard measurements, a number of measurements must be taken: first, the AC signal is read and nulled; second, a positive DC voltage measurement is taken; third, the AC signal is again measured and nulled; fourth, a minus DC voltage measurement is taken; and fifth, the AC signal is again read and nulled. The AC signal's RMS value is then computed by summing the amplitudes of the two DC voltage readings and dividing by two. The resultant RMS value is considered valid only if the unknown signal has not significantly drifted, as determined by the three measurements of the unknown signal. When great care is exercised, the best transfer measurement accuracy that is realizable (using a thermocouple as the temperature sensor) with this five step measurement process is an uncertainty of about 10 ppm. An uncertainty of about 25 ppm is generally more typical.

As an alternative to a thermocouple, the temperature of the heater wire can also be sensed with a sensing wire having a high temperature coefficient of resistivity. Typically, the sensing wire is wrapped about and electrically insulated from the heater wire. The electrical resistance of the sensing wire is measured to determine the temperature of the heater wire. (Further particulars concerning this type of sensing device can be found in application Ser. No. 580,450 entitled "Resistive Sensing Thermal Device for Current Measurement," inventor Fred L. Katzmann, filed Feb. 15, 1984 and assigned to the assignee of this application.) This means for sensing the heater wire temperature may eliminate most of the errors caused by the Peltier and Thomson effects; however, the improvement may not be sufficient to allow the user of the AC-DC transfer standard to dispense with the five step measurement process described above for the very highest precision transfer measurements.

As may be easily appreciated, the five step measurement process to determine the RMS value of an AC signal is quite cumbersome. Using this process, it can take perhaps one day to calibrate and certify a precision DC voltmeter. Making only one DC voltage measurement certainly would hasten the process, but, given present techniques, only at the expense of unacceptable measurement error due to DC reversal error in the thermoelement.

SUMMARY OF THE INVENTION

The present invention allows the use of a single DC voltage transfer measurement by generating a reversal error compensation signal. Specifically, the invention comprises means for generating digital information that is a function of the amplitude of the voltage across the heater wire. Means are also provided for generating a reversal error compensation signal, which means are responsive to the means for generating digital information. The generated signal has an amplitude that is a function of the previously generated digital information. Means are also provided for generating a compensated sensor signal that is a function of the reversal error compensation signal and the uncompensated sensor signal. The amplitude of the compensated sensor signal approximates very closely the amplitude of the sensor signal that would be generated in the absence of a Peltier and Thomson effects.

The foregoing invention substantially eliminates errors resulting from Thomson and Peltier effects, and only one DC transfer reading need take place to determine the RMS value of an unknown signal. In a preferred embodiment described below, the error is typically less than 10 ppm. As a result, measurement speed and accuracy are greatly increased.

DESCRIPTION OF THE PREFERRED EMBODIMENTS

Figure 1:
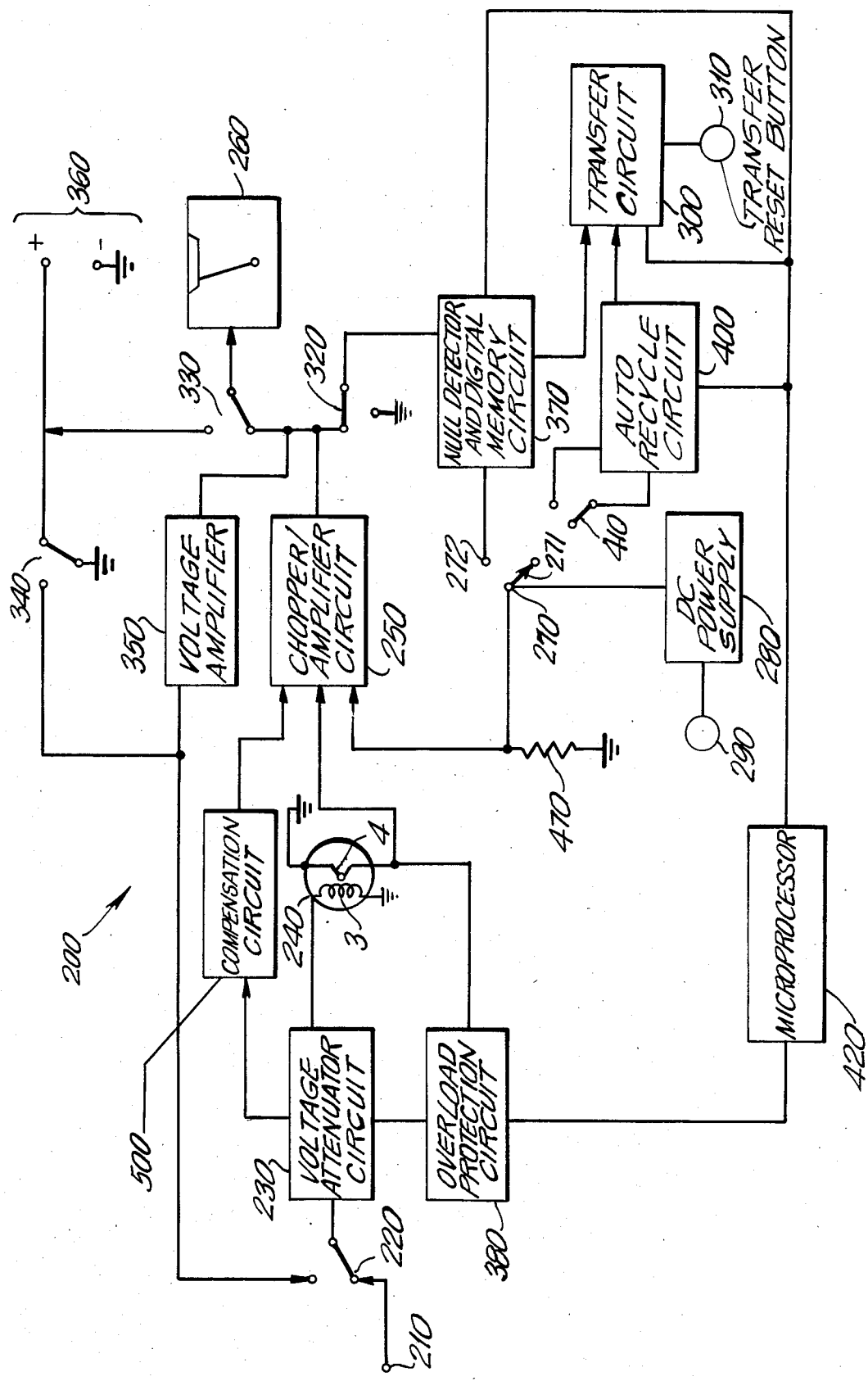
FIG. 1 is a block diagram of an AC-DC transfer standard.

FIG. 1 is a block diagram of an AC-DC transfer standard 200 of a type in which the present invention is utilized. Although this preferred embodiment uses a thermocouple, and not a sensing wire with a high temperature coefficient of resistivity, the present invention is applicable to transfer standards using either temperature sensor. Referring to FIG. 1, AC signals to be measured are applied to AC input connector 210, passed through switch 220 and into voltage attenuator circuit 230. Circuit 230 attenuates the voltage of the applied AC signal so that the voltage applied to the heater wire 3 of thermoelement 240 does not exceed a maximum allowable voltage. The attenuated AC signal passes through heater wire 3 of thermoelement 240, thereby causing the heater wire to heat up.

Thermocouple 4 of thermoelement 240 develops a DC output signal related to the RMS value of the attenuated AC input signal. This DC output signal is chopped and amplified in chopper/amplifier circuit 250. Chopping the DC signal eliminates the drift problems normally associated with the measurement of a low-level DC voltage, such as is produced by thermocouple 4.

The DC signal issued by thermoelement 240 can be either manually or automatically balanced by appropriate positioning of selector switch 270. FIG. 1 shows selector switch 270 set in manual balance mode position 271. In the manual balance mode, the operator varies the output of DC power supply 280 via knob 290 until its output balances the potential produced by thermocouple 4. At that point, the output of chopper/amplifier circuit 250 is zero and balance meter 260 indicates that balance, or a null condition, has been achieved.

The operator next actuates transfer circuit 300 by pressing transfer reset button 310; this causes switches 220, 320, 330 and 340 to switch from their AC positions to their DC positions. After switching, no voltage is supplied to heater wire 3. In consequence, the output from thermocouple 4 immediately drops to zero. The voltage from DC power supply 280 then creates an error signal through chopper/amplifier circuit 250, since no balancing potential is produced by thermocouple 4. The error signal is amplified by amplifier 350, and then passes via switch 220 and voltage attenuator 230 to heater wire 3 of thermoelement 240.

The joule heating of heater wire 3 of thermoelement 240 causes a voltage to be developed in thermocouple 4. In consequence, the potential developed by thermocouple 4 and power supply 280 quickly balances and the output voltage of DC amplifier/chopper circuit 250 drops to zero (nulls). When the voltage drops to zero, the DC output of the voltage amplifier 350 is equal to the RMS value of the applied AC signal. That DC output voltage is available at binding posts 360.

In automatic operation, selector switch 270 is placed in auto transfer/auto balance mode position 272. The DC output signal from thermocouple 4 is chopped and amplified in circuit 250 and fed via switch 320 to null detection and memory circuit 370. An appropriate memory circuit is disclosed in U.S. Pat. No. 3,518,525 to J. J. Duckworth et al., patented June 30, 1970, the contents of which are incorporated by reference in this disclosure. Null detection and digital memory circuit 370 automatically develops a DC balance voltage through a digital to analog converter, which balances the output of thermocouple 4 of thermoelement 240. At that time, amplifier/chopper circuit 250 has an output of zero volts and balance meter 260 indicates a null condition. Null detector and digital memory circuit 370 communicates the existence of a null condition to microprocessor 420, which in turn actuates transfer circuit 300, locking the DC balance voltage and causing switches 220, 320, 330 and 340 to switch from their AC to DC settings. Operation then proceeds as described above for manual balance.

Switch 410 can be actuated by the operator to activate auto recycle circuit 400. When activated, circuit 400 will, after DC balance has been achieved, automatically cause transfer circuit 300 to switch the transfer standard from the DC balance mode back to its AC mode, by moving switches 220, 320, 330 and 340 from their DC positions to their AC positions. Microprocessor 420 controls switching functions, as described above, and determines when transfer standard 200 should not be activated due to overload.

The voltage applied to heater 3 of thermoelement circuit 240 is monitored by overload protection circuit 380. This circuit detects when the heater element is subject to potentially damaging current. When that situation occurs overload protection circuit 380 causes voltage attenuator circuit 230 to disconnect heater wires from the potentially damaging voltage transient. An appropriate overload protection circuit for an AC-DC transfer standard is disclosed in an application entitled "AC-DC Transfer Standard Overload Protection Circuit," Ser. No. 728,845, filed on Apr. 30, 1985, and assigned to the assignee of this application. FIG. 1 also shows compensation circuit 400, which is depicted in greater detail in FIG. 2.

Figure 2:
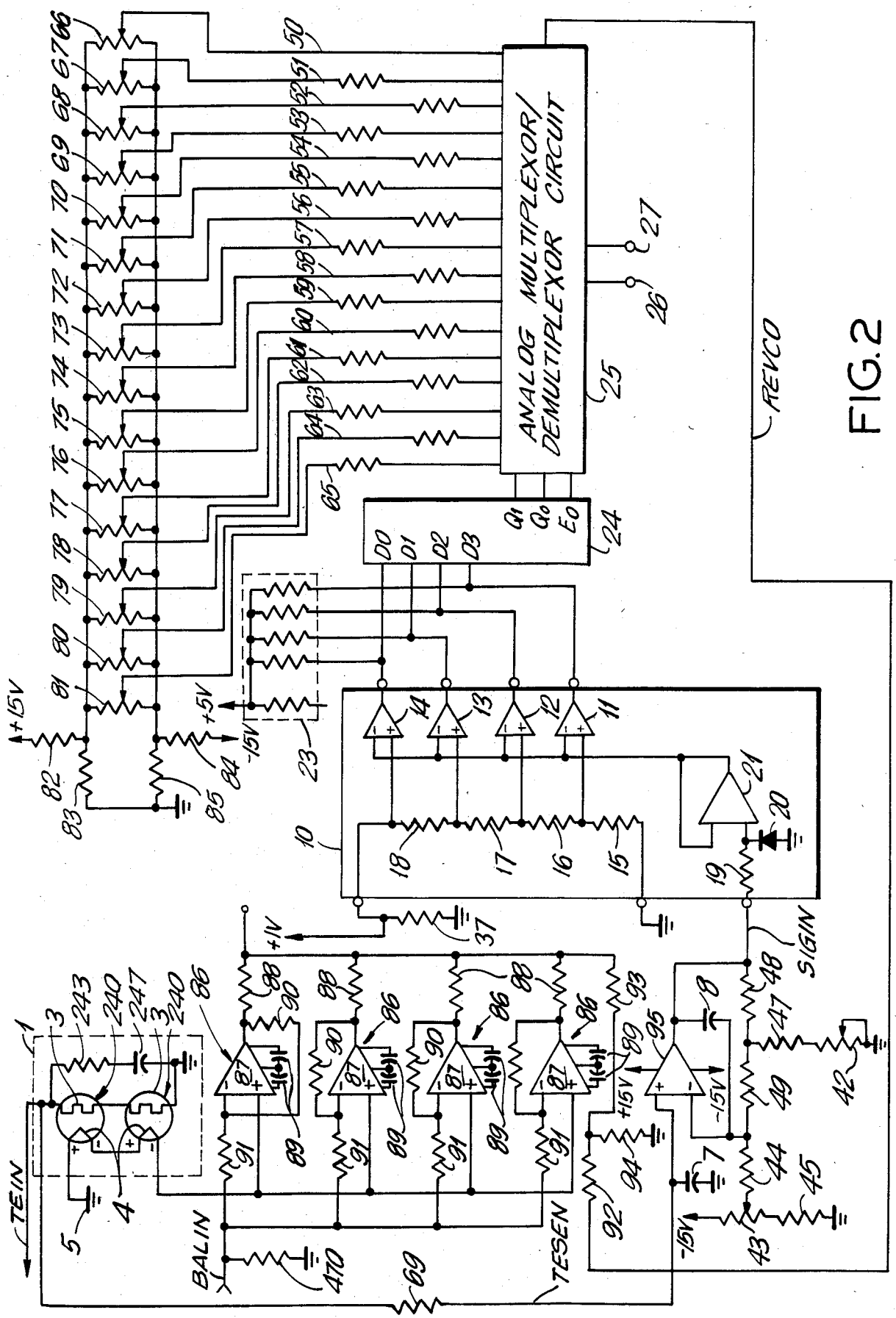
FIG. 2 is a schematic of this invention and its associated components.

FIG. 2 shows dual thermoelement assembly 1. Dual thermoelement assembly 1 contains a first thermoelement 240 and a second thermoelement 240. Each thermoelement 240 contains a heater wire 3 and a thermocouple junction 4 enclosed in a vacuum or partial vacuum, with thermocouple junction 4 thermally contacting, but electrically insulated from, the center of heater wire 3. Two matched thermoelements are used rather than one to help minimize DC reversal error and yield a higher output voltage. The heater wires are connected in series and grounded at 5. A signal is input to the thermoelement heater wires 3 via line TEIN. The signal that is applied to line TEIN can be either the attenuated AC signal to be measured or the DC transfer voltage. Line TEIN is grounded through 196 ohm resistor 243 and 6.8 picofarad capacitor 247; this path to ground flattens the frequency response of the signal on line TEIN for signal frequencies of about 30–100 MHz.

Heater wires 3 cause potentials to be developed in thermocouples 4, the amplitude of those potentials being a function of the amplitude of the voltage drops across heater wires 3. The current developed by those potentials is fed through 10 megohm isolation resistor 69 to yield a thermoelement input level sensing signal on line TESEN. Line TESEN is connected to the positive input of amplifier 95 as shown in FIG. 2. A 1 microfarad capacitor 7 is connected between line TESEN and ground. Resistor 69 and capacitor 7 comprise a low pass filter to block AC signals from entering amplifier 95. In a presently preferred embodiment, amplifier 95 is an operational amplifier, type LM11CH, available from National Semiconductor Corporation, Santa Clara, Calif. 95051. Pin 7 of that amplifier is connected to a plus 15 volt power source, while pin 4 is connected to a minus 15 volt power source.

The output of amplifier 95 is fed back to the negative input of amplifier 95 via 1 microfarad capacitor 8 and a resistor circuit comprising resistors 42, 47, 48 and 49. Amplifier 95 has a gain of about 3 for DC signals and almost zero gain for AC signals exceeding approximately 3 Hz. The negative input of amplifier 95 is additionally connected to a resistor circuit comprising resistors 43, 44 and 45, which with the resistor circuit comprising resistors 42, 47, 48 and 49, allow adjustment of the voltage present on line SIGIN, which delivers the input signal to comparator circuit 10. FIG. 2 specifically shows that the negative input of amplifier 95 is connected via a 10 megohm resistor 44 to the adjustable contact of 1 kilohm variable resistor 43. One end of variable resistor 43 is connected to a minus 15 volt DC power source; the other end is grounded through 9.09 kilohm resistor 45. The negative input to amplifier 95 is also connected to the output of 95 via 1.96 kilohm resistor 48 and 332 kilohm resistor 49. The connection common to resistors 48 and 49 is grounded via 681 ohm resistor 47 and 200 ohm variable resistor 42.

Variable resistors 42 and 43 allow adjustment of the magnitude of the output of amplifier 95, as explained in greater detail below.

Line SIGIN is input to comparator circuit 10. Specifically, line SIGIN is connected to the positive input of unity gain buffer amplifier 21 via 20 kilohm resistor 19. The positive input of buffer amplifier 21 is grounded via rectifier 20, which prevents the positive input from experiencing a voltage more negative than minus 0.7 volt. The output of buffer amplifier 21 is fed back to its negative input.

The output of buffer amplifier 21 is connected to the negative inputs of comparators 11, 12, 13 and 14. Suitable comparison reference signals are developed and fed to the positive inputs of comparators 11, 12, 13 and 14. In a presently preferred embodiment, a plus 1 volt power source 37, grounded via 2.61 kilohm resistor 37, is connected to voltage divider 22. Voltage divider 22 comprises 2 kilohm resistors 15, 16, 17 and 18 connected in series. The positive inputs of comparators 11, 12, 13 and 14 are appropriately connected to voltage divider 22 so that the positive input of comparator 11 has a value of plus 0.25 volts, that of 12 has a value of plus 0.5 volts, that of 13 has a value of plus 0.75 volts, and that of 14 has a value of plus 1.0 volt.

Comparators 11–14 function as switches. For example, if the negative input of comparator 11 is more than plus 0.25 volts, the output voltage will be at the ground value, namely zero; however, if the negative input is less than plus 0.25 volts, the output essentially is that of an open circuit. The outputs of comparators 11–14 are each connected to a 47 kilohm resistor of resistor network 23, which in turn is connected to a plus 5 volt power source. In consequence, the outputs of comparators 11–14 have a value of either zero or plus 5 volts, depending upon the outcome of the comparison.

Comparator circuit 10 can be found on commercially available integrated circuit chips. In a presently preferred embodiment, comparator circuit 0 is implemented with a dot/bar display driver chip, type LM3914, available from National Semiconductor, Santa Clara, Calif. Specifically, the on-chip reference voltage source of 1.25 volts, available at pin 7, is fed back to pin 6 to supply the power to one lead of voltage divider 22. Pins 3 and 9 are connected to a plus 15 volt power source. Pin 4, the remaining end of voltage divider 22, is grounded. Pin 2 is connected to a minus 5 volt power source. Pin 2 is also connected to a minus 15 volt power source via 619 ohm resistor 306. Pin 2 is additionally connected to the anode of Zener diode 307, type 1N751. The cathode of diode 307 is connected to ground. Pins 12, 14, 16 and 18 are the outputs of comparators 14, 13, 12 and 11, respectively.

Resistors 42 and 43 are adjusted to scale the output of amplifier 95 to the operating range of comparator circuit 10. With TESEN at its full scale, maximum negative value (about −450 mV), resistor 43 is adjusted until the voltage on line SIGIN is zero. As a result, comparators 11, 12, 13 and 14 each have an output that essentially floats, causing the voltage on their output lines to be pulled up to a potential of plus 5 volts. Next, with line TESEN at its minimum negative operating value (about −190 mV), resistor 42 is adjusted to cause the least order comparator (comparator 14) to have a floating output, while the other comparators have an output at the ground value. As a result, the output voltages of comparators 11, 12 and 13 are zero, while the output voltage of comparator 14 is plus 5 volts.

Assigning the value of 1 to a plus 5 volt signal, and the value of 0 to a signal of approximately 0 volts, the outputs of comparators 11–14 can take on the set of values shown in Table A. These values are input to a priority encoder 24. Priority encoder 24 generates digital information according to the values of the outputs of comparators 11–14. In a presently preferred embodiment, a CMOS 8-bit combinational logic priority encoder, type CD4532B, is used, which encoder is available from RCA and others. Specifically, the outputs of comparators 14–11 are respectively used as the inputs to pins 10–13 (D0–D3) of the priority encoder. Pins 1–4 (D4–D7) are connected to a minus 5 volt power source, as is pin 8. Only three output lines are used; $Q_1$, from pin 7, $Q_0$, from pin 9, and $E_0$, from pin 15. Pins 5, 14 and 16 are connected to a plus 5 volt power source.

The approximate amplitude of the voltage across heater elements 3 is represented by the digital outputs $Q_0$ and $Q_1$ of priority encoder 24 (the "position code"). The position code contained on lines $Q_0$ and $Q_1$ are input to circuit 25. A 2-bit digital signal on lines 26 and 27, which identify the voltage range (the "range code") in which the transfer standard is operating, is also input to circuit 25. The range code on lines 26 and 27 is generated in voltage attenuator circuit 230, shown in FIG. 1, which attenuates the amplitude of the voltage experienced by heater wires 3.

The digital range code and position code input to circuit 25 causes selection of one of 16 voltages of preset magnitude for output, depending upon the input digital data. Referring to FIG. 2, the output of circuit 25 is selected by enabling one of lines 50–65. Each of lines 50–65 are respectively connected to one of the adjustable contacts of variable resistors 66–81, shown in FIG. 2. Each of variable resistors 66–81 has a value of 50 kilohms. Variable resistors 66–81 are connected in parallel to two voltage dividers; the first, consisting of 9.09 kilohm resistor 82 and 2.87 kilohm resistor 83, is connected between a plus 15 volt power source and ground; and the second, consisting of 9.09 kilohm resistor 84 and 2.87 kilohm resistor 85, is connected between a minus 15 volt power source and ground.

Lines 50–65 are broken down into four groups that correspond, in this preferred embodiment, to four input voltage ranges of the AC-DC transfer standard. Specifically, for the presently preferred embodiment, lines 50–53 correspond to the 0.25–0.5 voltage range; lines 54–57 correspond to the 0.5–1.0 input voltage range; lines 58–61 correspond to the 1.0–2.0 input voltage range; and lines 62–65 correspond to the range of all voltages in excess of 2.0 volts. Each of the four lines within a range corresponds to one of the four position codes generated by priority encoder 24. Line 53 has a 162 kilohm resistor between variable resistor 69 and circuit 25. Similarly, line 52 has a 68.1 kilohm resistor between variable resistor 68 and circuit 25, and line 51 has a 31.6 kilohm resistor between variable resistor 67 and circuit 25. Line 50 has no resistance element between variable resistor 66 and circuit 25. The same resistance is found in each of the lines corresponding to the same position code within a range. Thus, for example, lines 65, 61, 57 and 53 all contain a 162 kilohm resistor. Similarly, lines 64, 60, 56 and 52 all contain a 68.1 kilohm resistor; and lines 63, 59, 55 and 51 all contain a 31.6 kilohm resistor.

Depending upon the range code and position code input to circuit 25 on lines 26, 27, $Q_1$ and $Q_0$, one of lines 50–65 will be selected by circuit 25. The voltage present on the selected line will be gated to the output line REVCO of circuit 25. In the presently preferred embodiment, circuit 25 is a CMOS analog multiplexor/demultiplexor, type CD4067B, available from a number of vendors. Lines 50–65 are respectively connected to pins 16 through 23 and 2 through 9; data lines $Q_0$ and $Q_1$ from priority encoder 24 are respectively connected to pins 10 and 11. Range code input lines 26 and 27 are respectively connected to pins 14 and 13. Line REVCO is connected to pin 1. Pin 12 is connected to a minus 5 volt power source, whereas pin 24 is connected to a plus 5 volt power source.

It is necessary to replicate the position code lines for each of the lower (and most sensitive) transfer standard input voltage ranges because the reversal characteristics of heater wires 3 vary with the range multiplier resistance of voltage attenuator circuit 230. Above a power source AC voltage of about 4 volts, the source impedance no longer affects the DC reversal characteristics of thermoelements 240. At these higher AC voltages, the range multiplier resistance (200 ohms per full range volt) is much larger than the total resistance of heater wires 3 (about 90 ohms).

Line $E_0$ from priority encoder 24 is used to generate an inhibit signal to circuit 25. Line $E_0$ is actuated when the values of the output lines from comparator circuit 10 are all equal to 0. When line $E_0$ is actuated, it inhibits selection of one of lines 50–65 by circuit 25. Thus, if the voltage on line TESEN is more positive in amplitude than about −190 mV, selection is inhibited.

Variable resistors 66–81 are independently adjusted so that the voltage applied to output line REVCO compensates for Peltier and Thompson effects associated with heater elements 3.

The output signal lead of thermocouples 4 is amplified and then connected to line REVCO from circuit 25 to yield a thermocouple signal compensated for DC reversal error. In the embodiment shown in FIG. 2, the output of thermocouples 4 is connected to four amplifier/chopper circuits 86 wired in parallel. Each of amplifier/chopper circuits 86 comprises a chopper amplifier 87. The output of thermocouples 4 are connected to the positive terminal of chopper amplifier 87. The outputs of chopper amplifiers 87 are each connected to one lead of 100 kilohm resistors 88. In a presently preferred embodiment, chopper amplifier 87 is type 7652, available from Intersil, Inc., Cupertino, Calif., 95014. The other leads of resistors 88 are commonly connected. Pins 1 and 8 of each of amplifiers 87 are connected via a 1 microfarad capacitor 89, as are pins 2 and 8. The output of each of amplifiers 87 is fed back to its negative input terminal across 100 kilohm resistor 90. The negative input terminal of each amplifier 87 is connected to one lead of 200 ohm resistors 91. The other leads of 200 ohm resistors 91 are commonly connected to a null adjustment signal line (BALIN in FIG. 2) in turn connected to either power supply 280 or null detection and memory circuit 370, shown in FIG. 1, depending upon the mode of operation. A current flows through five ohm resistor 470, shown in FIGS. 1 and 2, either from DC power supply 280 in the manual balance mode, or from null detection and memory circuit 370 in the auto transfer/auto balance mode. This current develops the balancing voltage across resistor 470. At the balance point, or null point, this balancing voltage equals the output voltage of thermocouples 4. For best results, the resistance of resistor 470 should not be a strong function of temperature.

The output voltage of thermocouples 4 will change with variation in cold junction temperature. The temperature coefficient of resistor 470 can be used to compensate for this change by selecting an appropriate temperature coefficient for resistor 470 and appropriately locating that resistor.

The reversal error compensation voltage line REVCO is connected to two 100 kilohm resistors 92 and 93 connected in series, which in turn are connected to the common connection of the output leads of chopper/amplifier circuits 86. The common connection between resistors 92 and 93 is grounded via 1.96 kilohm resistor 94.

TABLE A

| Voltage on Line TESEN | Voltage to Negative Terminal of each Comparator, $V_{in}$ | Output of Comparator Number | | | |
|---|---|---|---|---|---|
| | | 11 | 12 | 13 | 14 |
| $V_{TESEN} \approx -450$ mV | $V_{in} < 0.250$ V | 1 | 1 | 1 | 1 |
| $-450 < V_{TESEN} < -340$ | $0.250$ V $< V_{in} < 0.500$ V | 0 | 1 | 1 | 1 |
| $-340 < V_{TESEN} < -270$ | $0.500$ V $< V_{in} < 0.750$ V | 0 | 0 | 1 | 1 |
| $-270 < V_{TESEN} < -190$ | $0.750$ V $< V_{in} < 1.000$ V | 0 | 0 | 0 | 1 |
| $V_{TESEN} \approx -190$ mV | $V_{in} < 1.000$ V | 0 | 0 | 0 | 0 |

We claim:

1. A compensation circuit for errors caused by current passing through the heater element of a thermal transfer device having a heater element and a temperature sensor, the temperature sensor generating an uncompensated sensor signal whose amplitude is dependent upon the amplitude of the voltage across the heater element, said circuit comprising:

(a) means for generating digital information that is a function of the amplitude of the voltage across the heater element;

(b) means, responsive to the digital information generating means, for generating a reversal error compensation signal; and (c) means for generating a compensated sensor signal, responsive to the reversal error compensation signal and the uncompensated sensor signal;

whereby the amplitude of the compensated sensor signal is approximately that of the sensor signal generated by the thermocouple in the absence of Peltier and Thompson effects.

2. The compensation circuit as in claim 1, wherein the means for generating digital information comprises:
   (a) a comparator circuit that is responsive to the voltage across the heater element, the comparator circuit for generating a signal that is a function of the voltage across the heater element; and
   (b) a priority encoder, responsive to the signal from the comparator circuit that is a function of the voltage across the heater element, the priority encoder generating digital information that is a function of the voltage across the heater element.

3. The compensation circuit as in claim 1, wherein the means for generating a reversal error compensation signal comprises:
   (a) a plurality of resistive elements, each of which that can be connected to a potential;
   (b) a selector circuit responsive to the digital information generating means;
   (c) the resistive elements connected to the selector circuit; and
   (d) the selector circuit capable of selecting one of the plurality of resistive elements, according to the digital information generating means, and outputting the voltage from the selected element as a reversal error compensation signal.

4. The compensation circuit as in claim 3, wherein each of the resistive elements is independently adjustable.

5. The compensation circuit as in claim 4, wherein each of the resistive elements comprises a variable resistor that can be connected across a potential difference.

* * * * *

UNITED STATES PATENT AND TRADEMARK OFFICE
CERTIFICATE OF CORRECTION

PATENT NO. : 4,659,910
DATED : April 21, 1987
INVENTOR(S) : Archie J. Harrison, Jr., Jerry Harper and Fred L. Katzmann It is certified that error appears in the above-identified patent and that said Letters Patent are hereby corrected as shown below:

Cover Page, under "Other Publications", "Ballantino Laboratories"

should be --Ballantine Laboratories--.

Col. 5, line 40, "sourLe" should be --source--;

line 62, "comparator circuit 0" should be --comparator circuit 10--.

Signed and Sealed this

Eighteenth Day of August, 1987

Attest:

DONALD J. QUIGG

Attesting Officer      Commissioner of Patents and Trademarks